United States Patent
Kojima et al.

(10) Patent No.: US 12,538,755 B2
(45) Date of Patent: Jan. 27, 2026

(54) MEMBER FOR SEMICONDUCTOR MANUFACTURING APPARATUS

(71) Applicant: NGK Insulators, Ltd., Nagoya (JP)

(72) Inventors: Mitsuru Kojima, Handa (JP); Hiroshi Takebayashi, Handa (JP); Jyunya Waki, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 383 days.

(21) Appl. No.: 18/180,929

(22) Filed: Mar. 9, 2023

(65) Prior Publication Data

US 2024/0006226 A1    Jan. 4, 2024

Related U.S. Application Data

(63) Continuation of application No. PCT/JP2022/026285, filed on Jun. 30, 2022.

(51) Int. Cl.
*H01L 21/687* (2006.01)
*H01L 21/67* (2006.01)

(52) U.S. Cl.
CPC .... *H01L 21/68785* (2013.01); *H01L 21/6715* (2013.01)

(58) Field of Classification Search
CPC ........... H01L 21/68785; H01L 21/6831; H01L 21/6833; H01L 21/67017; H01J 37/32449
See application file for complete search history.

(56) References Cited

U.S. PATENT DOCUMENTS 6,024,631 A    2/2000    Piper
2009/0168292 A1    7/2009    Watanabe et al.
(Continued)

FOREIGN PATENT DOCUMENTS

JP    2009-158829 A    7/2009
JP    3182120 U    3/2013
(Continued)

OTHER PUBLICATIONS

Aoki—JP-2022119338-A—Machine Translation and Original Copy (Year: 2022).*
(Continued)

*Primary Examiner* — Tyrone V Hall, Jr.
(74) *Attorney, Agent, or Firm* — BURR PATENT LAW, PLLC

(57) ABSTRACT

A member for a semiconductor manufacturing apparatus, the member has a wafer placement surface and includes: a plurality of gas outflow passages each having an opening on the wafer placement surface; a common gas passage that is in communication with the plurality of gas outflow passages; and at least one gas inflow passage that is in communication with the common gas passage from a surface of the member for a semiconductor manufacturing apparatus that is on an opposite side from the wafer placement surface, the number of the at least one gas inflow passage being smaller than the number of the gas outflow passages in communication with the common gas passage. Among the plurality of gas outflow passages, a gas outflow passage closer to the gas inflow passage has a larger gas passage resistance than a gas outflow passage farther from the gas inflow passage.

14 Claims, 11 Drawing Sheets

(56) References Cited

U.S. PATENT DOCUMENTS

| | | | |
|---|---|---|---|
| 2019/0198299 A1* | 6/2019 | Watanabe | H01L 21/67115 |
| 2020/0227291 A1 | 7/2020 | Ishikawa et al. | |
| 2022/0032501 A1 | 2/2022 | Aoki et al. | |

FOREIGN PATENT DOCUMENTS

| | | | |
|---|---|---|---|
| JP | 2014-049685 | A | 3/2014 |
| JP | 2017-123396 | A | 7/2017 |
| JP | 2019-117861 | A | 7/2019 |
| JP | 2020-057786 | A | 4/2020 |
| WO | 2020/217406 | A1 | 10/2020 |

OTHER PUBLICATIONS

Akasaka—JP-2020057786-A—Machine Translation and Original Copy (Year: 2020).*
International Search Report and Written Opinion (Application No. PCT/JP2022/026285) dated Aug. 9, 2022.
English translation of the International Preliminary Report on Patentability (Chapter I) dated Jan. 9, 2025 (Application No. PCT/JP2022/026285).

* cited by examiner

UPSTREAM → DOWNSTREAM

MEMBER FOR SEMICONDUCTOR MANUFACTURING APPARATUS

BACKGROUND OF THE INVENTION

1. Field of the Invention

The present invention relates to a member for a semiconductor manufacturing apparatus

2. Description of the Related Art

One previously known electrostatic chuck incudes: a ceramic plate having a wafer placement surface on its upper surface and including a built-in electrode; and a metallic base plate joined to the lower surface of the ceramic plate. PTL 1 discloses an electrostatic chuck including a ceramic plate having a wafer placement surface and including, disposed therein, a common gas passage extending parallel to the wafer placement surface, a plurality of gas outflow passages extending from the common gas passage to the wafer placement surface, and one gas inflow passage passing in the up-down direction through a base plate and in communication with the common gas passage.

CITATION LIST

Patent Literature

PTL 1: Japanese Unexamined Patent Application Publication No. 2017-123396

SUMMARY OF THE INVENTION

In PTL 1 described above, the plurality of gas outflow passages are in communication with the common gas passage. In a gas outflow passage closer to the gas inflow passage, the flow rate of the gas flowing through this gas outflow passage is larger in some cases. Generally, when a wafer placed on an electrostatic chuck is subjected to processing, a space on the back side of the wafer is filled in advance with a heat conductive gas (such as helium gas) through the gas outflow passages. However, before the space on the back side of the wafer is filled with the heat conductive gas, if the flow rates of the gas through the gas outflow passages differ from one another, heat exchange between the ceramic plate and the wafer is non-uniform over the wafer, and this may lead to unevenness in the temperature of the wafer, causing a problem.

The present invention has been made to solve the foregoing problem, and it is a principal object to reduce the differences among flow rates of the gas flowing out from the plurality of gas outflow passages in communication with the common gas passage.

[1] The member for a semiconductor manufacturing apparatus according to the present invention has a wafer placement surface and includes: a plurality of gas outflow passages each having an opening on the wafer placement surface; a common gas passage that is disposed inside the member and is in communication with the plurality of gas outflow passages; and at least one gas inflow passage that is in communication with the common gas passage from a surface of the member that is on an opposite side from the wafer placement surface, the number of the at least one gas inflow passage being smaller than the number of the plurality of gas outflow passages in communication with the common gas passage. Among the plurality of gas outflow passages, a gas outflow passage closer to the gas inflow passage has a larger gas passage resistance than a gas outflow passage farther from the gas inflow passage.

In this member for a semiconductor manufacturing apparatus, the gas introduced into the gas inflow passage flows through the common gas passage, is distributed to the plurality of gas outflow passages connected to the common gas passage, passes through the gas outflow passages, and then flows out from the wafer placement surface. Since the number of the at least one gas inflow passage is smaller than the number of the gas outflow passages, the number of gas introduction tubes externally connected to the at least one gas inflow passage can be reduced. Among the plurality of gas outflow passages, a gas outflow passage closer to the gas inflow passage has a larger gas passage resistance than a gas outflow passage farther from the gas inflow passage. Therefore, the flow rates of the gas flowing out from the plurality of gas outflow passages in communication with the common gas passage do not significantly differ from each other. Thus, the occurrence of a problem caused by temperature unevenness in the wafer can be reduced.

[2] In the member for a semiconductor manufacturing apparatus according to the present invention (the member for a semiconductor manufacturing apparatus according to [1]), the gas passage resistance of each of the gas outflow passages may be adjusted by changing a length or a cross-sectional area of a spiral portion provided in the each of the gas outflow passages or adjusted by changing a length or a density of a porous portion provided in the each of the gas outflow passages. In this case, the gas passage resistance can be adjusted using the relatively simple structure.

[3] The member for a semiconductor manufacturing apparatus according to the present invention (the member for a semiconductor manufacturing apparatus according to [1] or [2]) may further include: a ceramic plate that includes an electrode embedded therein and has the wafer placement surface on its upper surface; and an electrically conductive base plate disposed on a lower surface of the ceramic plate. The common gas passage and the at least one gas inflow passage may be disposed in the electrically conductive base plate, and the gas outflow passages may be disposed in the electrically conductive base plate and the ceramic plate so as to extend from the common gas passage to the wafer placement surface.

[4] In the member for a semiconductor manufacturing apparatus according to the present invention (the member for a semiconductor manufacturing apparatus according to [3]), the electrically conductive base plate may include a refrigerant flow path, and the common gas passage may be disposed below the refrigerant flow path within the electrically conductive base plate. The gas passage resistance of each of the gas outflow passages may be adjusted in a portion of the each of the gas outflow passages that extends from the common gas passage to an upper surface of the electrically conductive base plate. In this case, since each portion extending from the common gas passage to the upper surface of the base plate is relatively long, the gas passage resistance can be relatively easily adjusted by utilizing the long portion.

[5] In the member for a semiconductor manufacturing apparatus according to the present invention (the member for a semiconductor manufacturing apparatus according to [3] or [4]), the electrically conductive base plate may include insulating sleeves disposed in respective base plate through holes that pass in the up-down direction through the electrically conductive base plate, and each of the insulating sleeves may have at least one first communication hole that forms part of the common gas passage and a second communication hole that is provided so as to extend from the first communication hole to an upper surface of the each of the insulating sleeves and that forms part of a corresponding one of the gas outflow passages. Moreover, the gas passage resistance of each of the gas outflow passages may be adjusted using the second communication hole of a corresponding one of the insulating sleeves. In this case, the gas passage resistances can be adjusted using the insulating sleeves that are members separate from the ceramic plate and the base plate. When the second communication hole of an insulating sleeve that is part of a gas outflow passage deteriorates during the use of the member for a semiconductor manufacturing apparatus, the insulating sleeve can be removed from the lower surface side of the base plate, and a new insulating sleeve can be attached. Therefore, maintenance for discharge prevention can be performed relatively easily.

[6] In the member for a semiconductor manufacturing apparatus according to the present invention (the member for a semiconductor manufacturing apparatus according to [5]), each of the insulating sleeves may be a single non-separable member. In this case, the insulating sleeve can be replaced more easily than an insulating sleeve composed of a plurality of members.

[7] In the member for a semiconductor manufacturing apparatus according to the present invention (the member for a semiconductor manufacturing apparatus according to [5] or [6]), in each of the insulating sleeves, the at least one first communication hole may include at least three communication holes extending radially in different directions with the second communication hole at a center in plan view. In this case, with the insulating sleeves inserted into the base plate through holes, the gas flowing through the common gas passage can be delivered to the gas outflow passages irrespective of the rotation positions of the insulating sleeves.

[8] In the member for a semiconductor manufacturing apparatus according to the present invention (the member for a semiconductor manufacturing apparatus according to any of [5] to [7]), the outer diameter of each of the insulating sleeves may be smaller than the width of the common gas passage. In this case, part of the gas flowing from the upstream side of the common gas passage can flow to the downstream side of the common gas passage through the outside of each insulating sleeve.

[9] In the member for a semiconductor manufacturing apparatus according to the present invention (the member for a semiconductor manufacturing apparatus according to any of [5] to [8]), the ceramic plate and the electrically conductive base plate may be joined together with an electrically conductive joint layer, and the insulating sleeves may be inserted into the electrically conductive joint layer. In this case, portions of the gas outflow passages that pass through the electrically conductive joint layer are also covered with the insulating sleeves, and the occurrence of discharge in these portions can be prevented.

In the member for a semiconductor manufacturing apparatus according to the present invention (the member for a semiconductor manufacturing apparatus according to any of [5] to [9]), the upper surface of each of the insulating sleeves may be bonded to the ceramic plate with an upper resin bonding layer therebetween, and a lower portion of the each of the insulating sleeves may be attached to the electrically conductive base plate with a lower resin bonding layer or a sealing material therebetween. In this case, the insulation on the upper surface side of the insulating sleeves can be maintained, and leakage of the gas from the outer circumference of each insulating sleeve to the outside can be prevented.

DETAILED DESCRIPTION OF THE INVENTION

Figure 1:
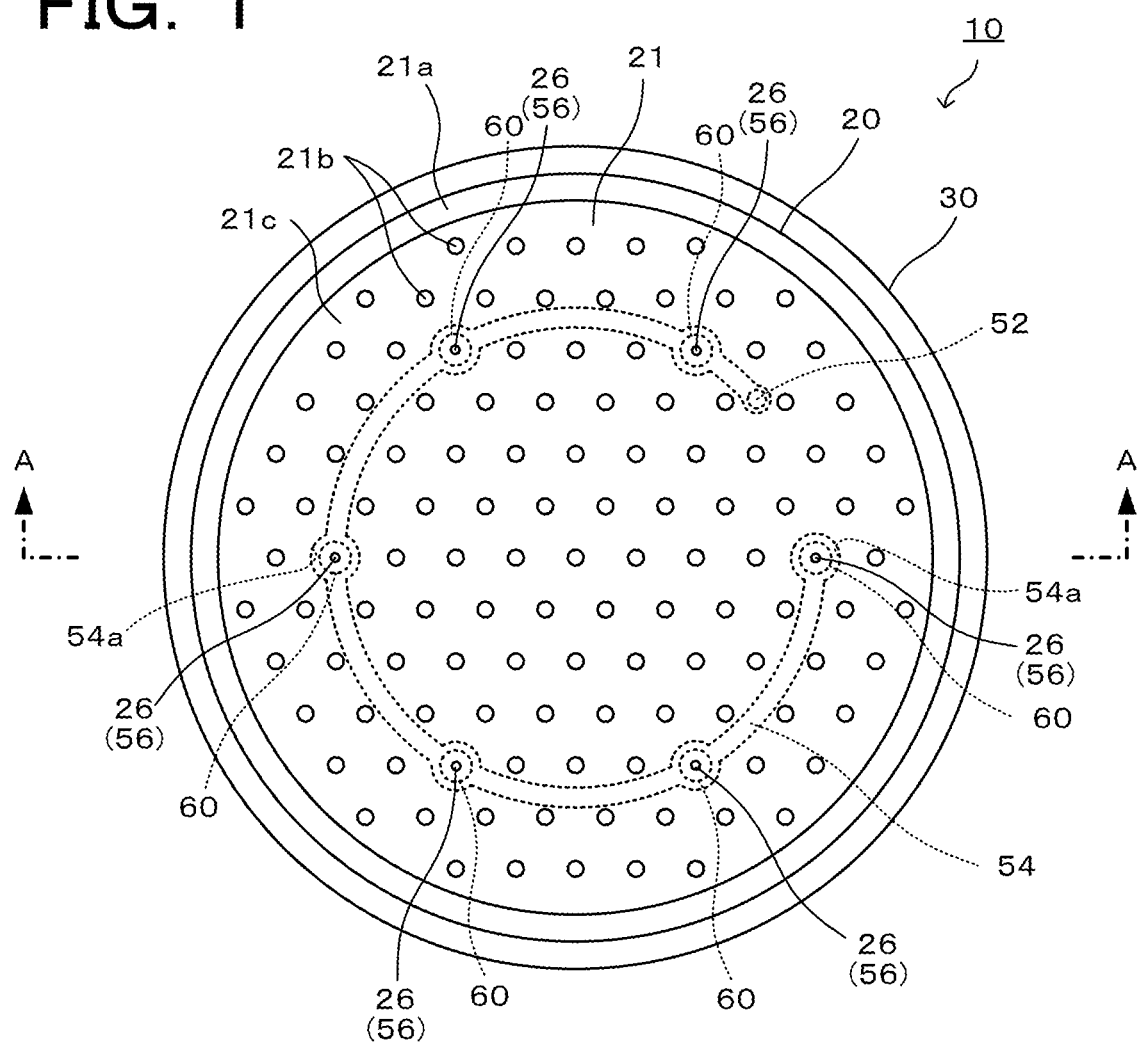
FIG. 1 is a plan view of a wafer placement table
Figure 2:
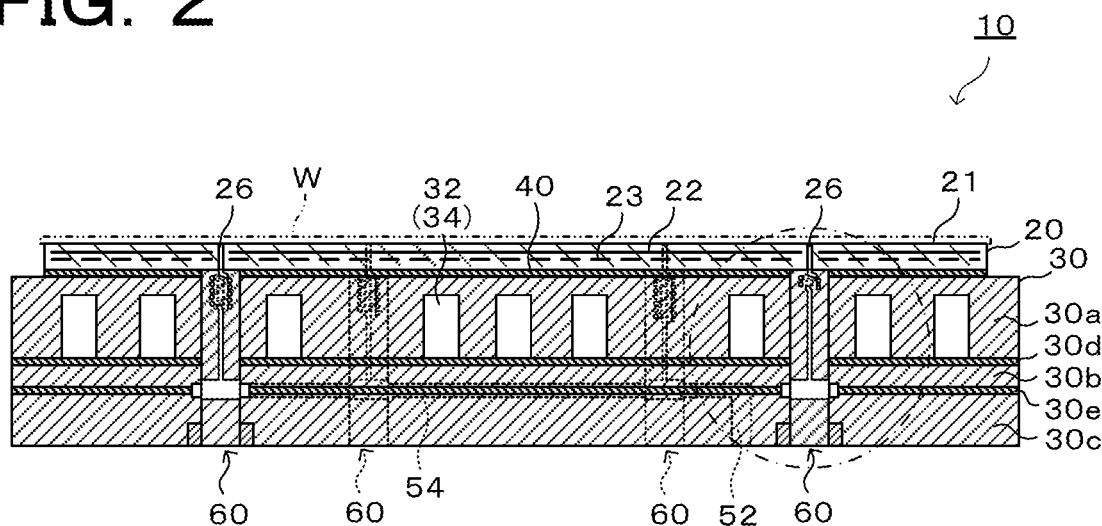
FIG. 2 is a cross-sectional view taken along A-A in FIG. 1.
Figure 3:
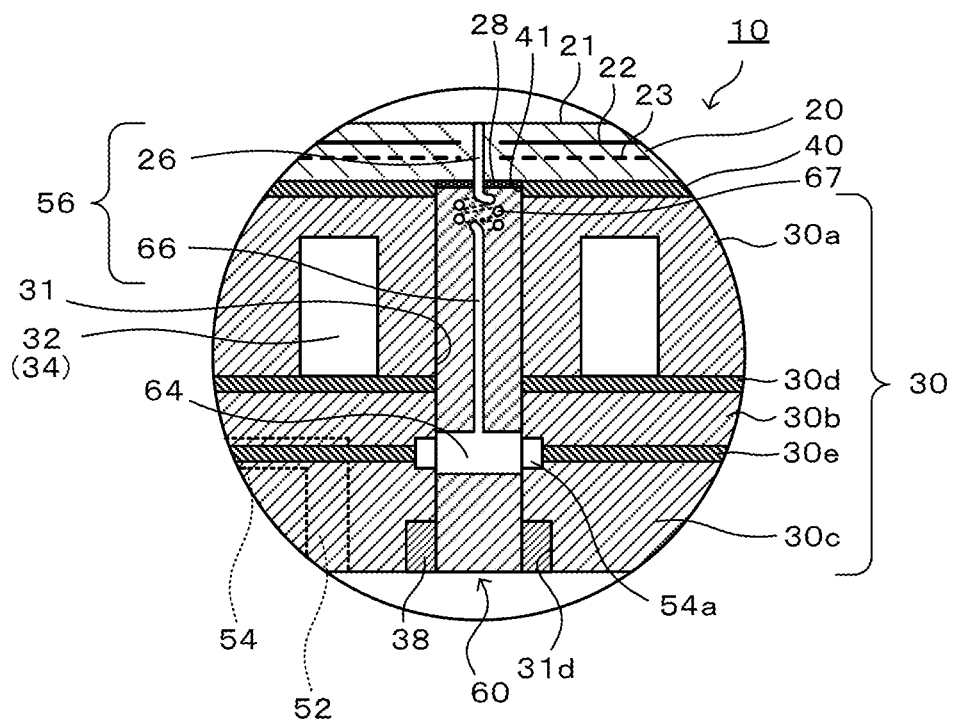
FIG. 3 is a partial enlarged view of FIG. 2.
Figure 4:
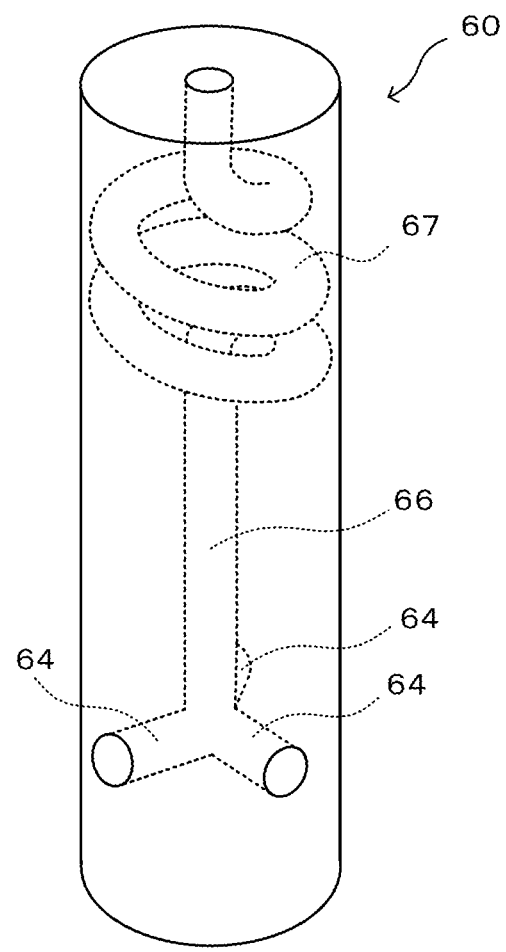
FIG. 4 is a perspective view of an insulating sleeve 60.
Figure 5:
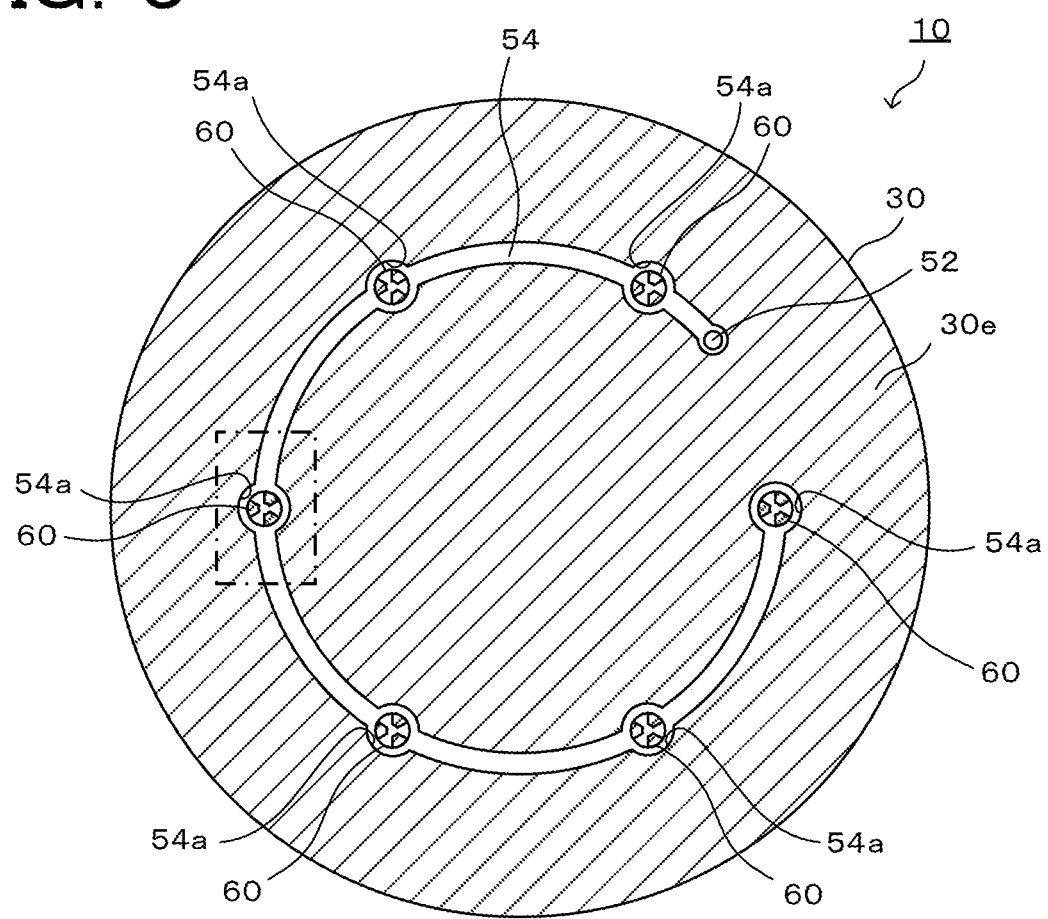
FIG. 5 is a cross-sectional view of the wafer placement table 10 cut along a horizontal plane passing through a common gas passage 54, the section being viewed from above.
Figure 6:
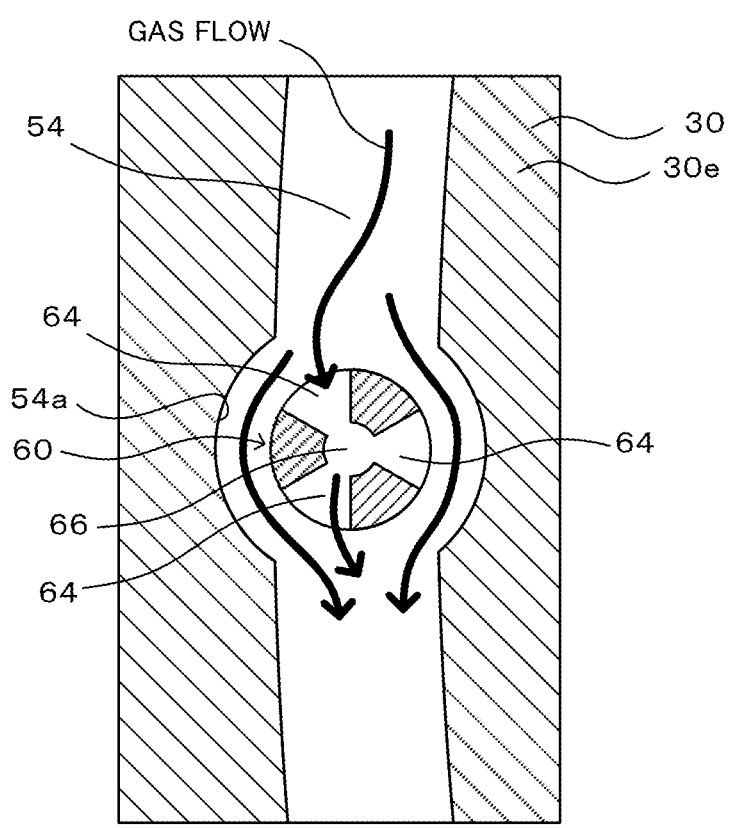
FIG. 6 is a partial enlarged view of FIG. 5.
Figure 7:
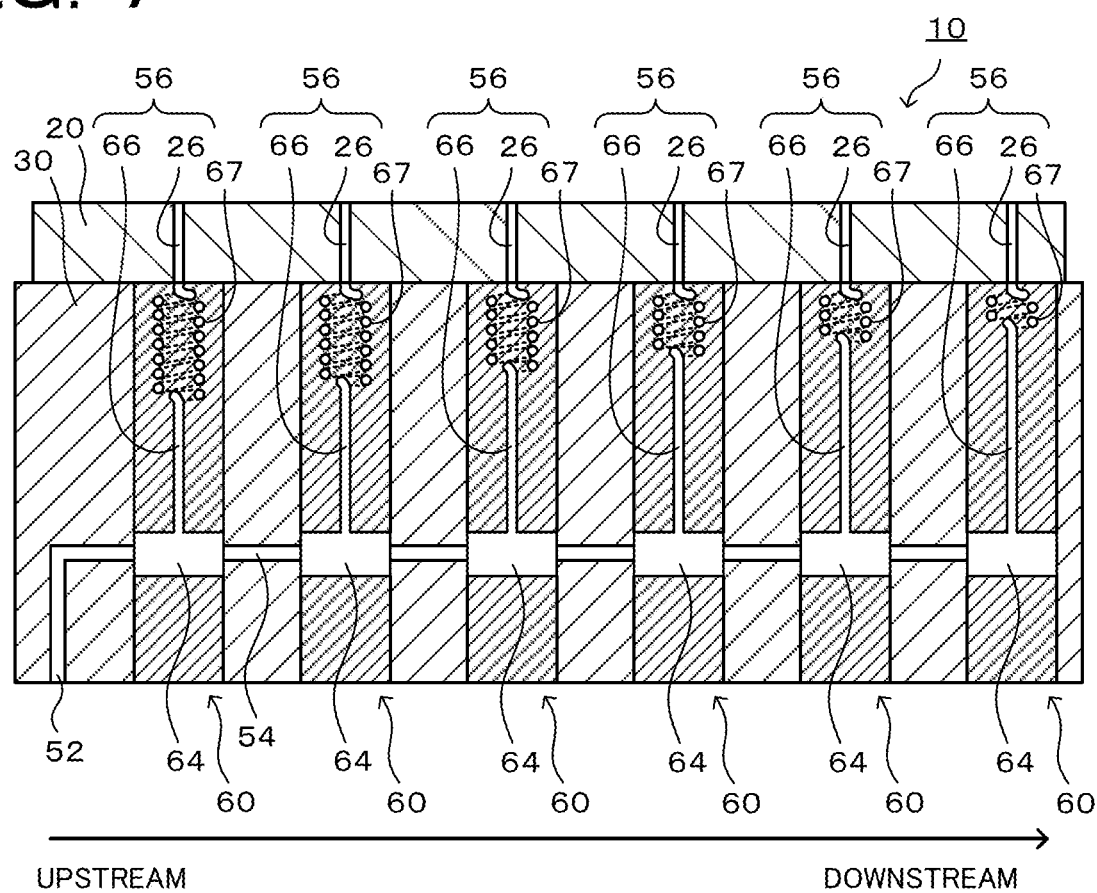
FIG. 7 is a schematic illustration showing a gas inflow passage 52, the common gas passage 54, and gas outflow passages 56.

A preferred embodiment of the present invention will next be described using the drawings. FIG. 1 is a plan view of a wafer placement table 10, and FIG. 2 is a cross-sectional view taken along A-A in FIG. 1. FIG. 3 is a partial enlarged view of FIG. 2 (an enlarged view of a portion inside a dash-dot line frame), and FIG. 4 is a perspective view of an insulating sleeve 60. FIG. 5 is a cross-sectional view of the wafer placement table 10 cut along a horizontal plane passing through a common gas passage 54, the section being viewed from above. FIG. 6 is an enlarged view of FIG. 5 (an enlarged view of a portion inside a dash-dot line frame), and FIG. 7 is a schematic illustration of a gas inflow passage 52, the common gas passage 54, and gas outflow passages 56. In the present description, the terms "upper" and "lower" do not indicate absolute positional relations but indicate relative positional relations. Therefore, the terms "upper" and "lower" may indicate "lower" and "upper," respectively, indicate, "left" and "right," or indicate "front" and "rear" depending on the orientation of the wafer placement table 10.

The wafer placement table 10 is an example of the member for a semiconductor manufacturing apparatus according to the present invention and includes a ceramic plate 20, a base plate 30, an electrically conductive joint layer 40, a common gas passage 54, at least one gas inflow passage 52, gas outflow passages 56, and insulating sleeves 60, as shown in FIG. 2.

The ceramic plate 20 is a disk (e.g., having a diameter of 300 mm and a thickness of 5 mm) made of a ceramic such as an alumina sintered body or an aluminum nitride sintered body. The upper surface of the ceramic plate 20 is a wafer placement surface 21 on which a wafer W is to be placed. An electrostatic electrode 22 and a heater electrode 23 are embedded in the ceramic plate 20 in this order from a side close to the wafer placement surface 21. As shown in FIG. 1, an annular seal band 21a is formed along the outer circumferential edge of the wafer placement surface 21 of the ceramic plate 20, and a plurality of small circular protrusions 21b are formed over the entire region inside the seal band 21a. The height of the seal band 21a is the same as the height of the small circular protrusions 21b, and these heights are, for example, several micrometers to several tens of micrometers. A portion of the wafer placement surface 21 on which the seal band 21a and the small circular protrusions 21b are not formed is referred to as a reference surface 21c. The ceramic plate 20 has a plurality of gas injection holes 26 that form part of the gas outflow passages 56. The plurality of gas injection holes 26 (six gas injection holes in this embodiment) are arranged on a circle concentric with the ceramic plate 20. Each of the gas injection holes 26 has an opening on the reference surface 21c in the wafer placement surface 21.

The electrostatic electrode 22 is a flat mesh electrode and is connected to an external DC power source through an unillustrated feeder member. The feeder member is electrically insulated from the electrically conductive joint layer 40 and the base plate 30. When a DC voltage is applied to the electrostatic electrode 22, a wafer W is sucked and fixed to the wafer placement surface 21 (specifically, the upper surface of the seal band 21a and the upper surfaces of the small circular protrusions 21b) by electrostatic suction force. When the application of the DC voltage is released, the wafer W sucked and fixed to the wafer placement surface 21 is released.

The heater electrode 23 is a resistance heating element that is formed in a one-stroke pattern from a first end to a second end in plan view so as to extend over the entire ceramic plate 20. A heater power source is connected to the first and second ends of the heater electrode 23 through unillustrated feeder members. The feeder members are electrically insulated from the electrically conductive joint layer 40 and the base plate 30. When energized, the heater electrode 23 generates heat and heats the wafer placement surface 21 and thus the wafer W.

The base plate 30 is a disk having high electric conductivity and thermal conductivity (a disk having the same diameter as or a larger diameter than the ceramic plate 20). In the present embodiment, the base plate 30 is produced by joining a first layer 30a, a second layer 30b, and a third layer 30c together using electrically conductive joint layers 30d and 30e.

A refrigerant flow path 32 through which a refrigerant circulates is formed inside the base plate 30. The refrigerant flow path 32 is composed of a refrigerant flow path groove 34 that is a concave groove formed on the lower surface of the first layer 30a and the electrically conductive joint layer 30d that covers a lower opening of the refrigerant flow path groove 34. The refrigerant flowing through the refrigerant flow path 32 is preferably a liquid and preferably an electrically insulating liquid. The electrically insulating liquid is, for example, a fluorine-based inert liquid. The refrigerant flow path 32 is formed into a one-stroke pattern from a first end (inlet) to a second end (outlet) in plan view so as to extend over the entire base plate 30. A supply port and a recovery port of an unillustrated external refrigerant device are connected to the first and second ends, respectively, of the refrigerant flow path 32. The refrigerant supplied from the supply port of the external refrigerant device to the first end of the refrigerant flow path 32 passes through the refrigerant flow path 32, returns from the second end of the refrigerant flow path 32 to the recovery port of the external refrigerant device, is subjected to temperature adjustment, and again supplied to the first end of the refrigerant flow path 32 through the supply port. The base plate 30 is connected to a radio frequency (RF) power source and used also as an RF electrode.

Examples of the material of the base plate 30 include metal materials and metal-ceramic composite materials. Examples of the metal materials include Al, Ti, Mo, and alloys thereof. Examples of the metal-ceramic composite materials include metal matrix composite materials (MMCs) and ceramic matrix composite materials (CMGs). Specific examples of these composite materials include materials containing Si, SiC, and Ti (referred to also as SiSiCTi), materials prepared by impregnating SiC porous bodies with Al and/or Si, and $Al_2O_3$—TiC composite materials. Preferably, as the material of the base plate 30, a material having a coefficient of thermal expansion close to that of the material of the ceramic plate 20 is selected. The first layer 30a, the second layer 30b, and the third layer 30c in the base plate 30 may be formed of any of the metal materials and the metal-ceramic composite materials described above, and the electrically conductive joint layers 30d and 30e may be formed of the same material as the material of the electrically conductive joint layer 40 described later.

The electrically conductive joint layer 40 is, for example, a metal joint layer and joins together the lower surface of the ceramic plate 20 and the upper surface of the base plate 30. The electrically conductive joint layer 40 is formed, for example, by TCB (thermal compression bonding). The TCB is a well-known method in which a metallic joint member is sandwiched between two members to be joined together and the two members are heated to a temperature equal to or lower than the solidus temperature of the metallic joint member to pressure-bond the two members.

The common gas passage 54 is formed inside the base plate 30 so as to be parallel to the wafer placement surface 21 (i.e., the horizontal direction). The term "parallel" refers not only to a completely parallel arrangement but also to an arrangement that is not a completely parallel arrangement but is a substantially parallel arrangement within an allowable error (e.g., tolerance) range. As shown in FIG. 2, the common gas passage 54 is a passage disposed between the second layer 30b and the third layer 30c of the base plate 30 and extending below the refrigerant flow path 32. The vertical height of the common gas passage 54 covers the vertical height (thickness) of the electrically conductive joint layer 30e. As shown in FIG. 5, the common gas passage 54 is formed into a C-shape (arc shape) in plan view and has a plurality of (six in this case) sleeve insertion portions 54a arranged from one end to the other end. Each sleeve insertion portion 54a is a portion of the common gas passage 54 that is bulged into an arc shape in plan view, and its inner diameter is larger than the outer diameter of the corresponding insulating sleeve 60. Spaces through which the gas can pass are formed between the insulating sleeve 60 and the arc-shaped walls of the sleeve insertion portion 54a. The plurality of sleeve insertion portions 54a are arranged along the common gas passage 54 at substantially regular intervals. The plurality of insulating sleeves 60 are arranged at substantially regular intervals on a circle concentric with a circle forming the outer shape of the wafer placement table 10.

The plurality of (six in this case) gas outflow passages 56 are provided for one common gas passage 54 so as to extend from the common gas passage 54 to the reference surface 21c in the wafer placement surface 21.

The at least one gas inflow passage 52 is disposed so as to extend from the lower surface of the base plate 30 (a surface of the wafer placement table 10 that is on an opposite side from the wafer placement surface 21) to one end of the common gas passage 54. The number of the at least one gas inflow passage 52 provided is less than the number of gas outflow passages 56 in communication with the common gas passage 54 and is one in the present embodiment.

As shown in FIG. 3, each insulating sleeve 60 is disposed in the corresponding base plate through hole 31 that passes in the up-down direction through the base plate 30. The insulating sleeve 60 is produced using an electrically insulating material (e.g., the same material as the material of the ceramic plate 20). The base plate through hole 31 is formed so as not to pass through the refrigerant flow path 32. As shown in FIG. 4, each insulating sleeve 60 is a single non-separable cylindrical columnar member and has first communication holes 64 forming part of the common gas passage 54 and a second communication hole 66 forming part of the corresponding gas outflow passage 56. The first communication holes 64 are disposed in horizontal directions. As shown in FIG. 6, in the present embodiment, the first communication holes 64 are formed so as to extend radially in three equally (or substantially equally) spaced directions with the second communication hole 66 at the center in plan view. Preferably, the first communication holes 64 are increased in diameter from the center of the insulating sleeve 60 in the radially outward direction. As shown in FIG. 3, the second communication hole 66 extends from the intersection of the first communication holes 64 along the center axis of the insulating sleeve 60 to the upper surface of the insulating sleeve 60. Each second communication hole 66 together with a corresponding one of the gas injection holes 26 of the ceramic plate 20 forms a corresponding one of the gas outflow passages 56. Each second communication hole 66 has a spiral portion 67. As shown in FIG. 3, an upper portion of the insulating sleeve 60 is inserted into a joint layer through hole 41 passing in the up-down direction through the electrically conductive joint layer 40 and bonded to the ceramic plate 20 with an insulating resin bonding layer 28 therebetween. A lower portion of each base plate through hole 31 is a large-diameter portion 31d whose diameter is larger than the other portion. A lower portion of each insulating sleeve 60 is bonded and fixed by a resin bonding layer 38 that fills the space between the insulating sleeve 60 and the large-diameter portion 31d of the corresponding base plate through hole 31.

FIG. 7 shows a cross-sectional view of the wafer placement table 10 cut in the vertical direction along the center line of the C-shaped common gas passage 54, the section being projected on a flat plane. FIG. 7 is an illustration showing the connection relation between the gas inflow passage 52, the common gas passage 54, and the gas outflow passages 56, and therefore components not relating to these passages are omitted. As for the lengths of the spiral portions 67 of the plurality of insulating sleeves 60, the spiral portion 67 of an insulating sleeve 60 closer to the gas inflow passage 52 (i.e., on the upstream side) has a larger length, and the spiral portion 67 of an insulating sleeve 60 farther from the gas inflow passage 52 (on the downstream side) has a smaller length. In this case, among the plurality of insulating sleeves 60, an insulating sleeve 60 closer to the gas inflow passage 52 has a larger gas passage resistance, and an insulating sleeve 60 farther from the gas inflow passage 52 has a smaller gas passage resistance. The number of turns of a spiral portion 67 may be used as the length of the spiral portion 67. As described above, the gas passage resistance of each gas outflow passage 56 is adjusted using its portion extending from the common gas passage 54 to the upper surface of the base plate 30, i.e., the second communication hole 66. The lengths of the spiral portions 67 of the insulating sleeves are set such that, when the gas is introduced into the gas inflow passage 52, the amounts of the gas injected from the gas injection holes 26 are the same (or substantially the same).

Figure 8A:
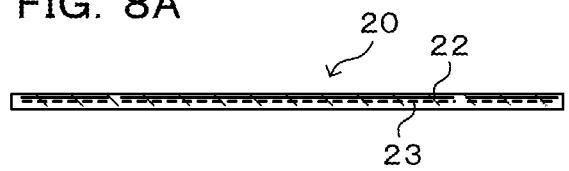
FIGS. 8A to 8G show illustrations showing a process for manufacturing the wafer placement table 10.

Next, an example of a method for manufacturing the wafer placement table 10 will be described with reference to FIGS. 8A to 8G. FIGS. 8A to 8G show illustrations of a process for manufacturing the wafer placement table 10. In this example, the base plate 30 is produced using an MMC. First, the ceramic plate 20 including the electrostatic electrode 22 and the heater electrode 23 embedded therein is prepared (FIG. 8A). For example, a ceramic powder-made molded body including the electrostatic electrode 22 and the heater electrode 23 embedded therein is produced, and the molded body is subjected to hot-press sintering to obtain the ceramic plate 20. Next, the gas injection holes 26 are formed in the ceramic plate 20 (FIG. 8B).

Figure 8C:
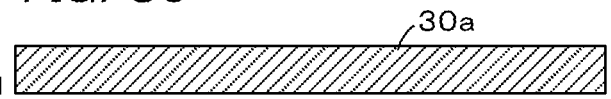
Figure 8B:
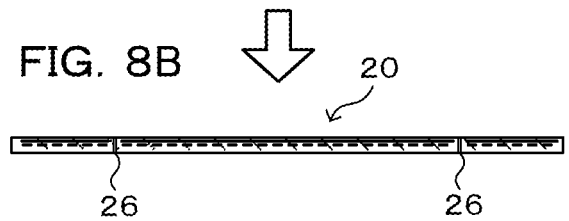
Figure 8D:
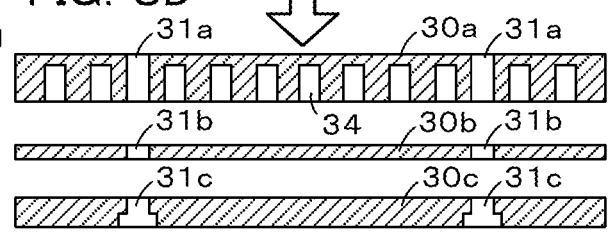

At the same time, MMC-made first to third layers to 30c are prepared (FIG. 8C). Then the first to third layers 30a to 30c are machined to appropriately form grooves and holes (FIG. 8D). Specifically, the refrigerant flow path groove 34 is formed on the lower surface of the first layer 30a. In addition, first layer through holes 31a passing in the up-down direction through the first layer 30a are formed in the first layer 30a. Moreover, second layer through holes 31b passing in the up-down direction through the second layer 30b are formed in the second layer 30b, and stepped third layer through holes 31c passing in the up-down direction through the third layer 30c are formed in the third layer 30c. The first layer through holes 31a to the third layer through holes 31c form the base plate through holes 31. Concave grooves (not shown) that finally become the common gas passage 54 are formed on the lower surface of the second layer 30b and the upper surface of the third layer 30c. For example, when the ceramic plate 20 is made of alumina, it is preferable that the first to third layers are 30c are made of SiSiCTi or AlSiC. This is because the coefficient of thermal expansion of alumina can be substantially the same as the coefficient of thermal expansion of SiSiCTi or AlSiC.

A SiSiCTi-made layer (disk member) can be produced, for example, as follows. First, silicon carbide, metallic Si, and metallic Ti are mixed to produce a powder mixture. Then the obtained powder mixture is subjected to uniaxial press forming to produce a disk-shaped molded body, and the molded body is subjected to hot-press sintering in an inert atmosphere to obtain a SiSiCTi-made disk member.

Figure 8E:
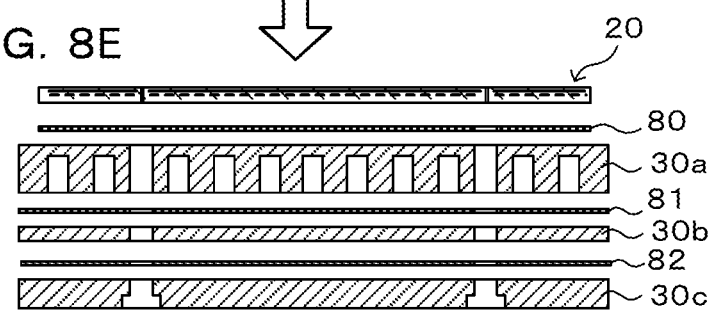
Figure 8F:
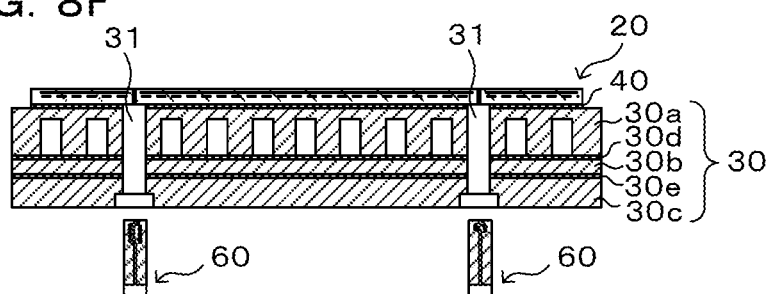

Next, a metallic joint member 82 is disposed between the third layer 30c and the second layer 30b, and a metallic joint member 81 is disposed between the second layer 30b and the first layer 30a. Moreover, a metallic joint member 80 is disposed between the first layer 30a and the ceramic plate 20 (FIG. 8E). Through holes are formed in advance in the metallic joint members 80, 81, and 82 at positions facing the first layer through holes 31a to the third layer through holes 31c. A through hole (long hole) is formed in advance in the metallic joint member 81 in a portion in which the common gas passage 54 is to be formed. Next, these layers are stacked to form a stacked body, and the stacked body is subjected to press-bonding at a temperature equal to or lower than the solidus temperature of the metallic joint members 80, 81, and 82 (for example, a temperature equal to or higher than the solidus temperature minus 20° C. and equal to or lower than the solidus temperature) and is then returned to room temperature. In this manner, the first layer 30*a* to the third layer 30*c* are joined together through the electrically conductive joint layers 30*d* and 30*e* converted from the metallic joint members 81 and 82 and thereby form the base plate 30, and the ceramic plate 20 and the base plate 30 are joined together through the electrically conductive joint layer 40 converted from the metallic joint member 80 (FIG. 8F). The first layer through holes 31*a* to the third layer through holes 31*c* are connected together to form the base plate through holes 31. The metallic joint members 80, 81, and 82 used may be Al—Mg-based joint members or Al—Si—Mg-based joint members. For example, when the TCB is performed using Al—Si—Mg-based joint members, the stacked body is heated in a vacuum atmosphere and pressed.

Figure 8G:
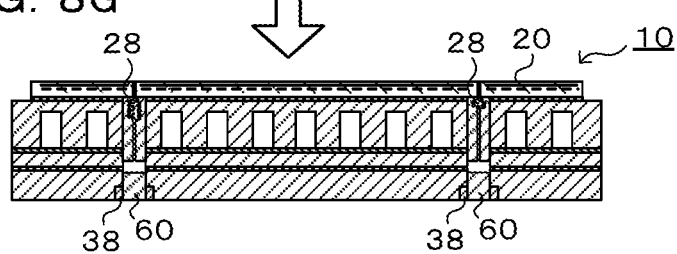

Next, a resin paste used as an adhesive is applied to portions of the ceramic plate 20 that are exposed at the bottoms of the base plate through holes 31, and the insulating sleeves 60 are inserted into the base plate through holes 31 and bonded to the ceramic plate 20. Finally, a lower circumferential portion of each insulating sleeve 60 is sealed with a resin paste. Therefore, upper portions of the insulating sleeves 60 are bonded to the ceramic plate 20 with the resin bonding layer 28 therebetween, and the lower portions of the insulating sleeves 60 are sealed by the resin bonding layer 38. In this manner, the wafer placement table 10 is obtained (FIG. 8G).

Next, an example of a method for producing each insulating sleeve 60 will be described. The insulating sleeve 60 can be produced according to "Method for manufacturing three-dimensional fired body" in WO2020/217406.

First, an insulating sleeve molded body is produced. The insulating sleeve molded body is to be fired to form an insulating sleeve 60. The dimensions of the insulating sleeve molded body are determined based on the dimensions of the insulating sleeve 60 in consideration of contraction during firing. The insulating sleeve molded body is produced using a forming die. The forming die includes a cup-shaped (closed-end tubular) main body and a core disposed thereinside. The shape of the inner space (forming space) of the forming die excluding the core is the same as the shape of the insulating sleeve molded body.

The forming die is produced using a well-known 3D printer. The 3D printer repeats a series of operations including discharging an uncured fluid from a head portion toward a stage to form an uncured layer-shaped object and curing the uncured layer-shaped object. The 3D printer is provided with a model material used as the uncured fluid and forming finally required portions of the forming die and a support material forming a base portion that supports the model material for the forming die and is to be finally removed. The model material used is a material (e.g., a wax such as paraffin wax) that is insoluble in a prescribed washing solution (such as water, an organic solvent, an acid, or an alkali solution), and the support material used is a material (e.g., a hydroxylated wax) that is soluble in the prescribed washing solution. The 3D printer forms a structure using slice data in which the forming die is horizontally sliced into layers at prescribed vertical intervals. The slice data is produced by processing CAD data. Some types of slice data include model material data and support material data in a mixed manner, and other types of slice data include only model material data. The structure formed by the 3D printer is immersed in a washing solution to dissolve and remove the cured support material, and an object formed only of the cured model material, i.e., the forming die, is thereby obtained.

The insulating sleeve molded body is produced using the obtained forming die by mold cast forming.

Specifically, a ceramic slurry containing a ceramic powder, a solvent, a dispersant, and a gelling agent is poured into a forming space of the forming die, and the ceramic slurry is gelated through a chemical reaction with the gelling agent to thereby produce the insulating sleeve molded body inside the forming die. Then only the forming die with the insulating sleeve molded body formed thereinside is removed by melting or combustion to thereby obtain the insulating sleeve molded body. Finally, the obtained insulating sleeve molded body is fired, and the outer dimensions of the fired body are adjusted to thereby obtain an insulating sleeve 60.

Next, an example of the use of the thus-produced wafer placement table 10 will be described. First, with the wafer placement table 10 placed in an unillustrated chamber, a wafer W is placed on the wafer placement surface 21. Then the chamber is evacuated using a vacuum pump, and the degree of vacuum is adjusted to a prescribed value. Then a DC voltage is applied to the electrostatic electrode 22 of the ceramic plate 20 to generate electrostatic suction force, and the wafer W is thereby sucked and fixed to the wafer placement surface 21 (specifically, the upper surface of the seal band 21*a* and the upper surfaces of the small circular protrusions 21*b*). Then the heater electrode 23 is energized to cause the ceramic plate 20 to generate heat, and the wafer W is thereby heated to a prescribed temperature. A backside gas is introduced into the gas inflow passage 52 from an unillustrated gas cylinder. The backside gas used is a heat conductive gas (such as He gas). The backside gas introduced into the gas inflow passage 52 flows through the common gas passage 54, is distributed to the plurality of gas outflow passages 56, and filled and sealed in a space between the back side of the wafer W and the reference surface 21*c* in the wafer placement surface 21 (the space surrounded by the back side of the wafer W, the seal band 21*a* and the small circular protrusions 21*b* on the wafer placement surface 21, and the reference surface 21*c* in the wafer placement surface 21). The presence of the backside gas allows heat to transfer efficiently between the wafer W and the ceramic plate 20. Next, a reactive gas atmosphere at a prescribed pressure (e.g., several tens to several hundreds of Pa) is formed inside the chamber. With this state maintained, an RF voltage is applied between an unillustrated upper electrode disposed in a ceiling portion of the chamber and the base plate 30 of the wafer placement table 10 to generate plasma. The surface of the wafer W is treated with the generated plasma. The refrigerant is appropriately circulated through the refrigerant flow path 32 in the base plate 30.

As shown in FIG. 6, the heat conductive gas flowing into the gas inflow passage 52 reaches an insulating sleeve from the upstream side of the corresponding sleeve insertion portion 54*a* in the common gas passage 54. Then part of the heat conductive gas flows into one of the first communication holes 64 of the insulating sleeve 60. Part of the gas flowing into the one of the first communication holes 64 passes through the second communication hole 66 and the corresponding gas injection hole 26 (i.e., the corresponding gas outflow passage 56) and is supplied to the space on the back side of the wafer W. The rest of the gas passes through another one of the first communication holes 64 and flows to the downstream side of the insulating sleeve in the common gas passage 54. The gas that did not flow into the one of the first communication holes 64 of the insulating sleeve 60 passes though spaces between the insulating sleeve 60 and the sleeve insertion portion 54*a* in the common gas passage 54 and flows to the downstream side of the insulating sleeve 60.

Before the space between the back side of the wafer W and the reference surface 21*c* in the wafer placement surface 21 is filled with the backside gas, the backside gas is gradually accumulated in the space. In this stage, if the flow rates of the gas through the gas outflow passages 56 differ from each other, heat exchange between the ceramic plate 20 and the wafer W is non-uniform over the wafer W. However, in the present embodiment, the gas passage resistances of the plurality of gas outflow passages 56 are adjusted such that the flow rates of the gas through the gas outflow passages 56 are substantially the same. Therefore, the non-uniformity in heat exchange between the ceramic plate 20 and the wafer W over the wafer W is unlikely to occur.

In the wafer placement table 10 described above in detail, the gas introduced into the gas inflow passage 52 flows through the common gas passage 54, is distributed to the plurality of gas outflow passages 56 disposed in the common gas passage 54, passes through the gas outflow passages 56, and flows out to the wafer placement surface 21. Since the number of the at least one gas inflow passage 52 is smaller than the number of gas outflow passages 56, the number of gas introduction tubes externally connected to the gas inflow passage 52 can be reduced. Among the plurality of gas outflow passages 56, a gas outflow passage 56 closer to the gas inflow passage 52 has a larger gas passage resistance than a gas outflow passage 56 farther from the gas inflow passage 52. Therefore, before the space between the back side of the wafer W and the reference surface 21*c* in the wafer placement surface 21 is filled with the gas, the flow rates of the gas flowing out from the plurality of gas outflow passages 56 in communication with the common gas passage 54 do not significantly differ from each other. Thus, the occurrence of a problem caused by temperature unevenness in the wafer W in this stage can be reduced.

The gas passage resistance of each gas outflow passage 56 is adjusted by changing the length of the spiral portion 67 disposed in the gas outflow passage 56. Therefore, the gas passage resistance can be adjusted using the relatively simple structure.

The gas passage resistance of each gas outflow passage 56 is adjusted in its portion extending from the common gas passage 54 to the upper surface of the base plate 30. The portion extending from the common gas passage 54 to the upper surface of the base plate 30 is relatively long. Therefore, the gas passage resistance can be relatively easily adjusted by utilizing this long portion.

The gas passage resistances are adjusted using the insulating sleeves 60 that are members separate from the ceramic plate 20 and the base plate 30. Therefore, when the second communication holes 66 of the insulating sleeves 60 that are part of the gas outflow passages 56 deteriorate during the use of the wafer placement table 10, the insulating sleeves 60 can be removed from the lower surface side of the base plate 30, and new insulating sleeves 60 can be attached. Thus, maintenance for discharge prevention can be easily performed.

Each insulating sleeve 60 is a single non-separable cylindrical member. Therefore, the insulating sleeve 60 can be replaced more easily than an insulating sleeve composed of a plurality of members.

The first communication holes 64 of each insulating sleeve 60 are disposed so as to extend radially in three directions with the second communication hole 66 at the center in plan view. Therefore, with the insulating sleeve 60 inserted into the corresponding base plate through hole 31, the gas flowing from the upstream side of the common gas passage 54 can be delivered to the second communication hole 66 (the gas outflow passage 56) irrespective of the rotation position of the insulating sleeve 60 (FIG. 6).

The outer diameter of each insulating sleeve 60 is smaller than the width of the corresponding sleeve insertion portion 54*a* of the common gas passage 54. Therefore, part of the gas flowing from the upstream side of the common gas passage 54 can flow to the downstream side of the common gas passage 54 through the outside of the insulating sleeve 60 (the spaces between the insulating sleeve 60 and the sleeve insertion portions 54*a*) (FIG. 6).

The ceramic plate 20 and the base plate 30 are joined together with the electrically conductive joint layer therebetween, and the insulating sleeves 60 are inserted into the electrically conductive joint layer 40. In this case, portions of the gas outflow passages 56 that pass through the electrically conductive joint layer 40 are also covered with the insulating sleeves 60, and therefore the occurrence of discharge in these portions can be prevented.

The upper surface of each insulating sleeve 60 is bonded to the ceramic plate 20 with the resin bonding layer 28 therebetween, and the lower portion of the insulating sleeve 60 is attached to the base plate 30 with the resin bonding layer 38 therebetween. Therefore, the insulation on the upper surface side of the insulating sleeve 60 can be maintained, and leakage of the gas through the outer circumference of the insulating sleeve 60 to the outside can be prevented.

One gas inflow passage 52 is provided for one common gas passage 54. Therefore, the number of gas inflow passages 52 provided in the base plate 30 can be reduced as much as possible.

The height of the first communication holes 64 of each insulating sleeve 60 covers the height of the common gas passage 54. Therefore, with each insulating sleeve 60 inserted into the corresponding base plate through hole 31, even if the first communication holes 64 of the insulating sleeve 60 are vertically displaced relative to the common gas passage 54 of the base plate 30, the possibility of a reduction in the cross sectional area of the common gas passage 54 is low.

The present invention is not at all limited to the embodiment described above. It will be appreciated that the present invention can be embodied in various forms so long as they fall within the technical scope of the invention.

Figure 9:
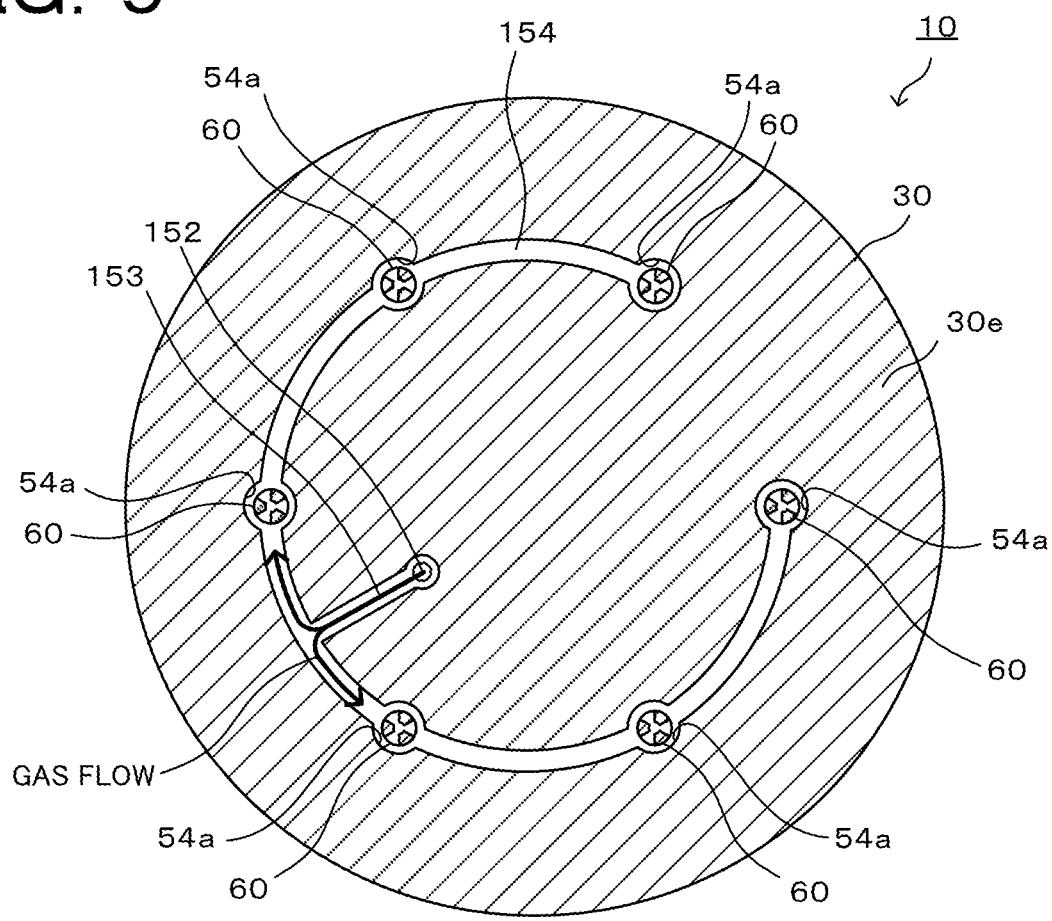
FIG. 9 is an illustration of a common gas passage 154.

In the embodiment described above, the gas inflow passage 52 is connected to one end of the common gas passage 54, but the invention is not particularly limited thereto. For example, as shown in FIG. 9, an auxiliary gas passage 153 may be formed so as to extend horizontally from the center of a common gas passage 154 having a C-shape in plan view toward the center of the wafer placement table 10, and a gas inflow passage 152 extending vertically from the lower surface of the base plate 30 may be connected to an end portion of the auxiliary gas passage 153. In this case, sleeve insertion portions 54*a* and insulating sleeves 60 are provided also at both ends of the common gas passage 154. The gas introduced into the gas inflow passage 152 flows from the auxiliary gas passage 153 to the common gas passage 54 and is then divided into two flows flowing clockwise and counterclockwise directions (see arrows in FIG. 9). Among the plurality of insulating sleeves 60, an insulating sleeve closer to the gas inflow passage 152 (i.e., on the upstream side) has a second communication hole with a larger gas passage resistance than that of an insulating sleeve 60 farther from the gas inflow passage 152 (i.e., on the downstream side). Therefore, in FIG. 9 also, the same operational advantages as those in the embodiment described above can be obtained. In FIG. 9, the same components as those in the embodiment described above are denoted by the same symbols.

Figure 10A:
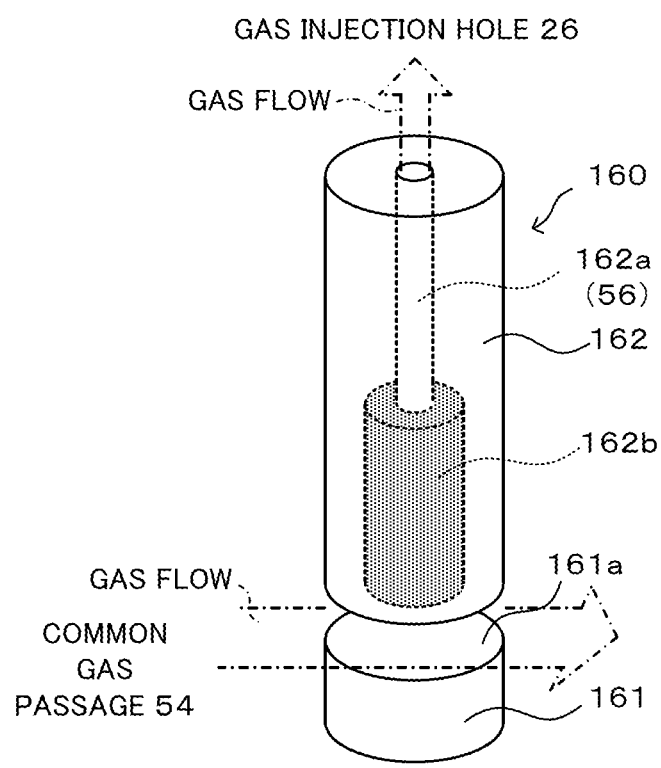
FIG. 10A is a perspective view of an insulating sleeve 160 and FIG. 10B is a vertical cross-sectional view.
Figure 10B:
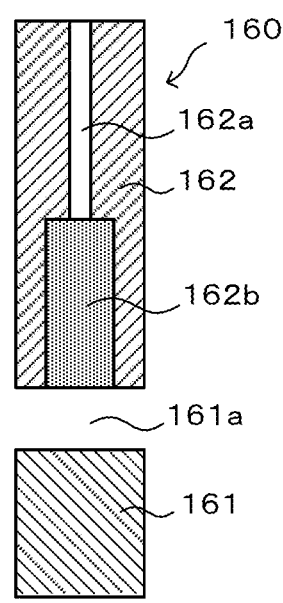

In the embodiment described above, each insulating sleeve 60 is a single non-separable member, but the invention is not particularly limited thereto. For example, instead of the insulating sleeve 60, an insulating sleeve 160 including a lower cylindrical body 161 and an upper cylindrical body 162 that are independent from each other may be used as shown in FIGS. 10A and 10B. FIG. 10A is a perspective view of the insulating sleeve 160, and FIG. 10B is its vertical cross-sectional view. The lower cylindrical body 161 and the upper cylindrical body 162 are made of an electrically insulating material (for example, the same material as the material of the ceramic plate 20). The lower cylindrical body 161 is a solid cylindrical body. A gap is formed between the upper surface of the lower cylindrical body 161 and the lower surface of the upper cylindrical body 162. This gap is a first communication hole 161a forming part of the common gas passage 54. The upper cylindrical body 162 has a second communication hole 162a. The second communication hole 162a is in communication with the corresponding gas injection hole 26 and forms a gas outflow passage 56 together with the gas injection hole 26. The second communication hole 162a includes a porous cylindrical body 162b in a portion extending from the lower surface of the upper cylindrical body 162 to a prescribed height above the lower surface (in a large-diameter housing portion). The height of the housing portion is the same as the height of the porous cylindrical body 162b. The porous cylindrical body 162b is press-fitted into the housing portion and allows the gas to flow in the vertical direction. The porous cylindrical body 162b is made of an electrically insulating material (for example, the same material as the material of the ceramic plate 20). A plurality of the insulating sleeves 160 are disposed in the common gas passage 54. Among the plurality of insulating sleeves 160, an insulating sleeve 160 closer to the gas inflow passage 52 (on the upstream side) has a housing portion and a porous cylindrical body 162b that have longer vertical lengths (i.e., has a larger gas passage resistance), and an insulating sleeve 160 farther from the gas inflow passage 52 (on the downstream side) has a housing portion and a porous cylindrical body 162b that have shorter vertical lengths (i.e., has a smaller gas passage resistance). Even with these insulating sleeves 160, the same effects as those in the embodiment described above are obtained. However, since each insulating sleeve 160 is composed of two independent members, its replacement operation is slightly more complicated than that for the insulating sleeve 60. Instead of adjusting the gas passage resistance by changing the vertical length of the porous cylindrical body 162b, the gas passage resistance may be adjusted by changing the density of the porous cylindrical body 162b. However, in consideration of the ease of adjustment, it is preferable to adjust the gas passage resistance by changing the vertical length of the porous cylindrical body 162b.

In the embodiment described above, the gas passage resistance of each insulating sleeve 60 is adjusted by changing the length of the spiral portion 67 disposed in the second communication hole 66 of the insulating sleeve 60, but the invention is not particularly limited thereto. For example, the gas passage resistance may be adjusted by changing the cross-sectional area (e.g., the hole diameter) of the passage in the spiral portion 67. Alternatively, the gas passage resistance may be adjusted as follows. The second communication hole 66 of the insulating sleeve 60 is formed so as not to have the spiral portion 67 but to extend linearly, and a needle valve is attached to the intersection of the second communication hole 66 and the first communication holes 64. The cross-sectional area of the passage extending from the first communication holes 64 to the second communication hole 66 is adjusted by changing the screwing amount of the needle valve to thereby adjust the gas passage resistance. However, a slight change in the cross-sectional area causes a large change in the gas passage resistance. Therefore, in consideration of workability during manufacturing, it is preferable to adjust the gas passage resistance not by changing the cross-sectional area but by changing the length.

Figure 11:
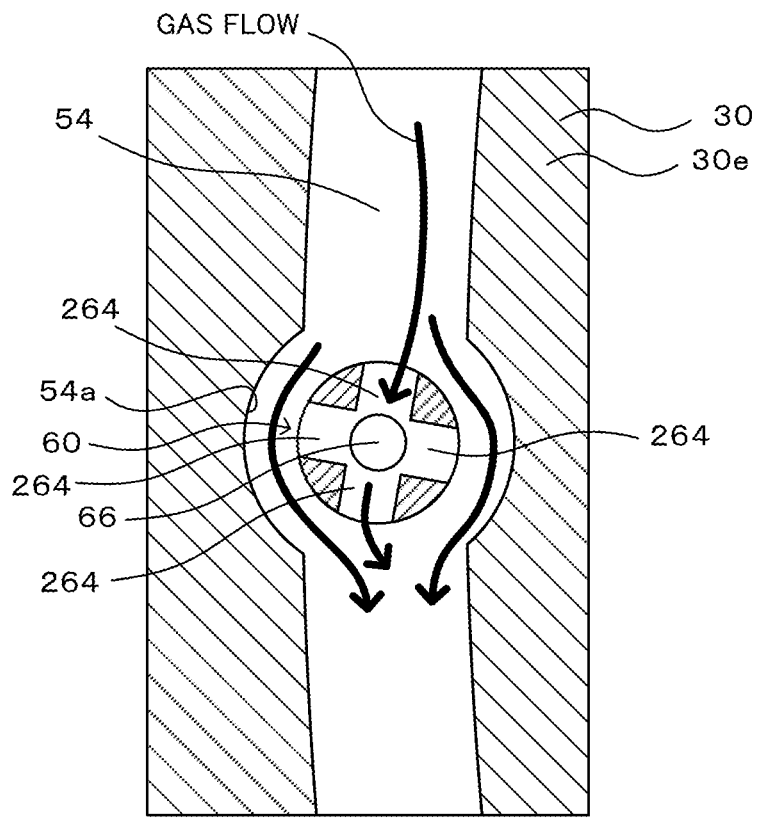
FIG. 11 is an illustration of an insulating sleeve 60 having first communication holes 264.
Figure 12:
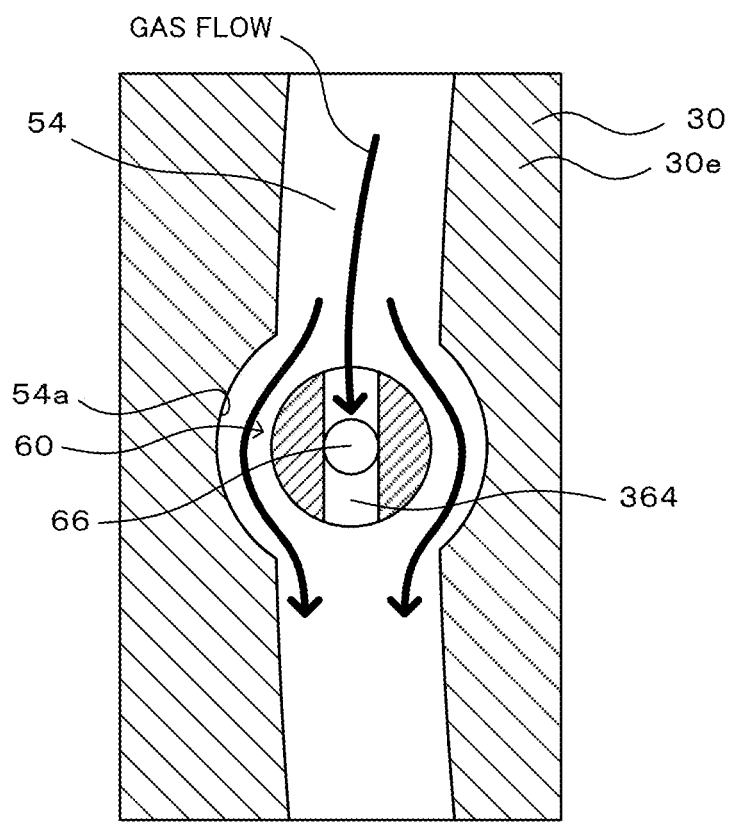
FIG. 12 is an illustration of an insulating sleeve 60 having a first communication hole 364.

In the embodiment described above, the first communication holes 64 of each insulating sleeve 60 are formed so as to extend radially in three directions with the second communication hole 66 at the center in plan view. However, first communication holes extending radially in four or more directions may be used. FIG. 11 is an illustration of an example in which first communication holes 264 are disposed so as to extend radially in four directions with the second communication hole 66 at the center in plan view. In this example, the four first communication holes 264 are formed so as to extend in equally (or substantially equally) spaced directions. In this case also, it is unnecessary to take the orientation of the first communication holes 264 into consideration when the insulating sleeve 60 is attached to the base plate through hole 31. Alternatively, as shown in FIG. 12, a linear first communication hole 364 that intersects the second communication hole 66 in plan view may be provided. In this case, it is necessary that the orientation of the linear first communication hole 364 and the orientation of the common gas passage 54 coincide with each other when the insulating sleeve 60 is attached to the base plate through hole 31. In FIGS. 11 and 12, the same components as those in the embodiment described above are denoted by the same symbols.

Figure 13:
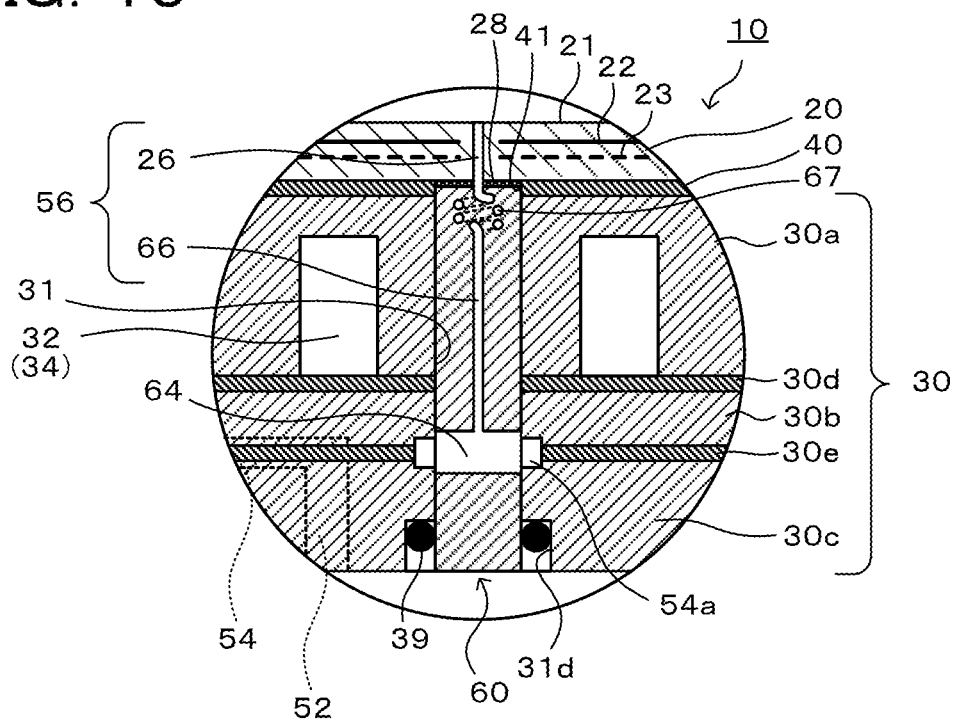
FIG. 13 is an illustration of an example in which a seal ring 39 is disposed in a lower portion of an insulating sleeve 60.

In the embodiment described above, the lower portion of each insulating sleeve 60 is bonded to the large-diameter portion 31d of the corresponding base plate through hole 31 and sealed with the resin bonding layer 38, but the invention is not particularly limited thereto. For example, as shown in FIG. 13, a seal ring 39 may be disposed between the insulating sleeve 60 and the large-diameter portion 31d of the base plate through hole 31 to prevent the gas from leaking from the outer circumference of the insulating sleeve 60 to the outside. The seal ring 39 may be made of a metal or a resin. In FIG. 13, the same components as those in the embodiment described above are denoted by the same symbols.

Figure 14:
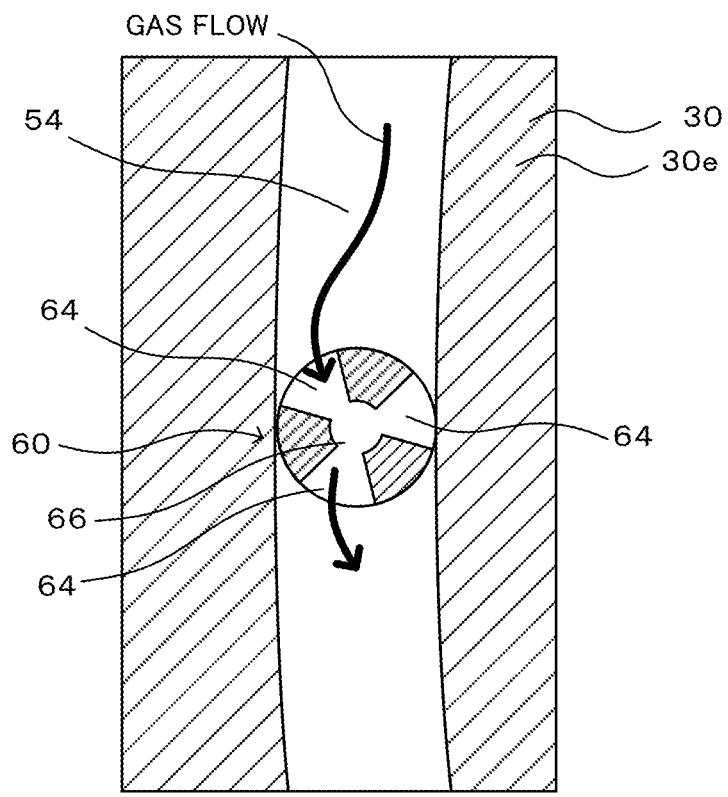
FIG. 14 is an illustration of an example in which the outer diameter of an insulating sleeve 60 substantially coincides with the width of the common gas passage 54.

In the embodiment described above, the spaces that allow the gas to pass therethrough are formed between each insulating sleeve 60 and the corresponding sleeve insertion portion 54a of the common gas passage 54, but the invention is not particularly limited thereto. For example, the sleeve insertion portions 54a may not be formed in the common gas passage 54, and the insulating sleeves 60 may have an outer diameter smaller than the width of the common gas passage 54. In this case also, the same operational advantages as those in the embodiment described above are obtained. Alternatively, as shown in FIG. 14, the arcuately bulged sleeve insertion portions 54a may be omitted. In this case, the outer diameter of the insulating sleeves 60 coincides (or substantially coincides) with the width of the common gas passage 54. In FIG. 14, the same components as those in the embodiment described above are denoted by the same symbols. In this case, the gas cannot flow through the outside of each insulating sleeve 60 to the downstream side of the common gas passage 54. However, the same operational advantages as those in the embodiment described above are obtained except for the above.

In the embodiment described above, a spiral portion 67 is disposed in each second communication hole 66 forming part of the corresponding gas outflow passage 56. However, a zigzag portion may be provided instead of the spiral portion 67, and the gas passage resistance may be adjusted by changing, for example, the length of the zigzag portion.

In the embodiment described above, the gas passage resistance of each gas outflow passage 56 is adjusted using the corresponding second communication hole 66 in the base plate 30, but the invention is not particularly limited thereto. For example, the gas passage resistance of the gas outflow passage 56 may be adjusted using the corresponding gas injection hole 26 in the ceramic plate 20.

In the embodiment described above, the common gas passage 54 is disposed in the base plate 30. However, the common gas passage may be disposed in the ceramic plate 20. In this case, the gas passage resistances are adjusted using passages extending from the common gas passage to the wafer placement surface.

In the embodiment described above, one gas inflow passage 52 is provided for the common gas passage 54. However, it is only necessary that the number of gas inflow passages 52 be smaller than the number of gas outflow passages 56 disposed in the common gas passage 54. For example, the number of gas inflow passages 52 provided for the common gas passage 54 may be two. In this case, to determine whether each of the plurality of gas outflow passages 56 is close to or far from the gas inflow passages 52, the distance from the gas outflow passage 56 to one of the gas inflow passages 52 that is closer to the gas outflow passage 56 may be used for the determination.

In the embodiment described above, the common gas passage 54 has a C-shape in plan view, but the invention is not particularly limited thereto. For example, the common gas passage 54 may have a spiral shape in plan view. Alternatively, a plurality of common gas passages 54 each having a C-shape in plan view may be disposed along a plurality of concentric circles.

In the embodiment described above, the electrostatic electrode 22 and the heater electrode 23 are embedded in the ceramic plate 20, but the invention is not particularly limited thereto. For example, only one of the electrostatic electrode 22 and the heater electrode 23 may be embedded in the ceramic plate 20. Alternatively, two or more heater electrodes 23 may be embedded so as to be stacked in the thickness direction.

In the embodiment described above, a lift pin hole piercing through the wafer placement table 10 may be provided. The lift pin hole is a hole for moving the wafer W vertically with respect to the wafer placement surface 21. When the wafer W is supported by, for example, three lift pins, there lift pin holes are formed at three positions.

In the embodiment described above, the ceramic plate 20 is produced by subjecting the ceramic powder-made molded body to hot-press firing. In this case, the molded body may be produced by stacking a plurality of tape-shaped molded bodies, may be produced by mold casting, or may be produced by compressing the ceramic powder into a compact.

International Application No. PCT/JP2022/026285, filed on Jun. 30, 2022, is incorporated herein by reference in its entirety.

What is claimed is:

1. A member for a semiconductor manufacturing apparatus, the member having a wafer placement surface, the member comprising: a plurality of gas outflow passages each having an opening on the wafer placement surface; a common gas passage that is disposed inside the member and is in communication with the plurality of gas outflow passages; and at least one gas inflow passage that is in communication with the common gas passage from a surface of the member that is on an opposite side from the wafer placement surface, the number of the at least one gas inflow passage being smaller than the number of the plurality of gas outflow passages in communication with the common gas passage, wherein, among the plurality of gas outflow passages, a gas outflow passage closer to the gas inflow passage has a larger gas passage resistance than a gas outflow passage farther from the gas inflow passage, and wherein the gas passage resistance of each of the gas outflow passages is adjusted by changing a length of a spiral portion provided in the each of the gas outflow passages or adjusted by changing a length or a density of a porous portion provided in each of the gas outflow passages.

2. The member for a semiconductor manufacturing apparatus according to claim 1, further comprising:
   a ceramic plate that includes an electrode embedded therein and has the wafer placement surface on its upper surface; and
   an electrically conductive base plate disposed on a lower surface of the ceramic plate,
   wherein the common gas passage and the at least one gas inflow passage are disposed in the electrically conductive base plate, and
   wherein the gas outflow passages are disposed in the electrically conductive base plate and the ceramic plate so as to extend from the common gas passage to the wafer placement surface.

3. The member for a semiconductor manufacturing apparatus according to claim 2, wherein the electrically conductive base plate includes a refrigerant flow path,
   wherein the common gas passage is disposed below the refrigerant flow path within the electrically conductive base plate, and
   wherein the gas passage resistance of each of the gas outflow passages is adjusted in a portion of the each of the gas outflow passages that extends from the common gas passage to an upper surface of the electrically conductive base plate.

4. The member for a semiconductor manufacturing apparatus according to claim 1, wherein the electrically conductive base plate includes two or more layers joined together by one or more electrically conductive joint layers.

5. The member for a semiconductor manufacturing apparatus according to claim 4, wherein the common gas passage is disposed between two of the layers of the electrically conductive base plate.

6. The member for a semiconductor manufacturing apparatus according to claim 5, wherein a vertical height of the common gas passage is substantially the same as a vertical height of the electrically conductive joint layer joining two layers of the electrically conductive base plate.

7. The member for a semiconductor manufacturing apparatus according to claim 1, wherein the common gas passage is C-shape in plan view.

8. A member for a semiconductor manufacturing apparatus, the member having a wafer placement surface, the member comprising:
- a plurality of gas outflow passages each having an opening on the wafer placement surface;
- a common gas passage that is disposed inside the member for a semiconductor manufacturing apparatus and is in communication with the plurality of gas outflow passages; and
- at least one gas inflow passage that is in communication with the common gas passage from a surface of the member for a semiconductor manufacturing apparatus that is on an opposite side from the wafer placement surface, the number of the at least one gas inflow passage being smaller than the number of the gas outflow passages in communication with the common gas passage,
- a ceramic plate that includes an electrode embedded therein and has the wafer placement surface on its upper surface; and
- an electrically conductive base plate disposed on a lower surface of the ceramic plate,
- wherein, among the plurality of gas outflow passages, a gas outflow passage closer to the gas inflow passage has a larger gas passage resistance than a gas outflow passage farther from the gas inflow passage,
wherein the common gas passage and the at least one gas inflow passage are disposed in the base plate,
- wherein the gas outflow passages are disposed in the base plate and the ceramic plate so as to extend from the common gas passage to the wafer placement surface,
- wherein the electrically conductive base plate includes insulating sleeves disposed in respective base plate through holes that pass in the up-down direction through the electrically conductive base plate,
- wherein each of the insulating sleeves has at least one first communication hole that forms part of the common gas passage and a second communication hole that is provided so as to extend from the first communication hole to an upper surface of the each of the insulating sleeves and that forms part of a corresponding one of the gas outflow passages, and
- wherein the gas passage resistance of each of the gas outflow passages is adjusted using the second communication hole of a corresponding one of the insulating sleeves.

9. The member for a semiconductor manufacturing apparatus according to claim 8, wherein the gas passage resistance of each of the gas outflow passages is adjusted by changing a length or a cross-sectional area of a spiral portion provided in the each of the gas outflow passages or adjusted by changing a length or a density of a porous portion provided in the each of the gas outflow passages.

10. The member for a semiconductor manufacturing apparatus according to claim 8, wherein each of the insulating sleeves is a single non-separable member.

11. The member for a semiconductor manufacturing apparatus according to claim 8, wherein, in each of the insulating sleeves, the at least one first communication hole comprises at least three communication holes extending radially in different directions with the second communication hole at a center in plan view.

12. The member for a semiconductor manufacturing apparatus according to claim 8, wherein the outer diameter of each of the insulating sleeves is smaller than the width of the common gas passage.

13. The member for a semiconductor manufacturing apparatus according to claim 8, wherein the ceramic plate and the electrically conductive base plate are joined together with an electrically conductive joint layer, and
- wherein the insulating sleeves are inserted into the electrically conductive joint layer.

14. The member for a semiconductor manufacturing apparatus according to claim 8, wherein the upper surface of each of the insulating sleeves is bonded to the ceramic plate with an upper resin bonding layer therebetween, and wherein a lower portion of the each of the insulating sleeves is attached to the electrically conductive base plate with a lower resin bonding layer or a sealing material therebetween.

* * * * *